US006776848B2

(12) United States Patent
Rosenstein et al.

(10) Patent No.: US 6,776,848 B2
(45) Date of Patent: Aug. 17, 2004

(54) MOTORIZED CHAMBER LID

(75) Inventors: Michael Rosenstein, Sunnyvale, CA (US); Alex Shenderovich, San Francisco, CA (US); Marc O. Schweitzer, San Jose, CA (US); Ilya Lavitsky, San Francisco, CA (US); Alvin Lau, San Francisco, CA (US); Michael Feltsman, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 84 days.

(21) Appl. No.: 10/053,296

(22) Filed: Jan. 17, 2002

(65) Prior Publication Data

US 2003/0131794 A1 Jul. 17, 2003

(51) Int. Cl.[7] .................... C23C 16/00; C23C 14/00; H01L 21/00; C25B 11/00
(52) U.S. Cl. ................ 118/726; 118/733; 118/715; 204/298.12
(58) Field of Search ................. 118/715, 726, 118/733; 204/298.12

(56) References Cited

U.S. PATENT DOCUMENTS

| | | | | |
|---|---|---|---|---|
| 4,226,208 A | 10/1980 | Nishida et al. | ............. | 118/706 |
| 4,253,417 A | 3/1981 | Valentijn | ............. | 118/733 |
| 4,416,102 A | * 11/1983 | Peters | ............. | 52/692 |
| 5,575,856 A | 11/1996 | Foster et al. | ............. | 118/733 |
| 5,731,678 A | * 3/1998 | Zila et al. | ............. | 318/568.11 |
| 5,837,059 A | 11/1998 | Glants | ............. | 118/733 |
| 5,863,397 A | 1/1999 | Tu et al. | ............. | 204/298.12 |
| 5,884,917 A | 3/1999 | Yamaga | ............. | 277/3 |
| 5,902,406 A | 5/1999 | Uchiyama et al. | ............. | 118/724 |
| 5,953,827 A | 9/1999 | Or et al. | ............. | 34/58 |
| 5,972,116 A | 10/1999 | Takagi | ............. | 118/719 |
| 6,042,707 A | * 3/2000 | Moslehi et al. | ............. | 204/298.16 |
| 6,050,446 A | * 4/2000 | Lei et al. | ............. | 220/819 |
| 6,095,083 A | 8/2000 | Rice et al. | ............. | 118/723 |
| 6,142,773 A | 11/2000 | Shimazu | ............. | 432/241 |
| 6,193,804 B1 | 2/2001 | Chang et al. | ............. | 118/733 |
| 6,194,733 B1 | * 2/2001 | Haas et al. | ............. | 250/492.2 |
| 6,198,299 B1 | * 3/2001 | Hollman | ............. | 324/758 |
| 6,235,121 B1 | 5/2001 | Honma et al. | ............. | 118/730 |
| 6,263,542 B1 | * 7/2001 | Larson et al. | ............. | 16/321 |
| 6,432,203 B1 | * 8/2002 | Black et al. | ............. | 118/504 |
| 6,469,448 B2 | * 10/2002 | Taguchi et al. | ............. | 315/11.21 |
| 6,565,662 B2 | * 5/2003 | Amano et al. | ............. | 118/715 |
| 2002/0117262 A1 | * 8/2002 | Pang et al. | ............. | 156/345.1 |

FOREIGN PATENT DOCUMENTS

| | | | | |
|---|---|---|---|---|
| EP | 1 093 154 A2 | 4/2001 | ............. | H01L/21/00 |
| JP | 59-145519 | 8/1984 | ............. | H01L/21/205 |
| JP | 3-120367 | 2/1991 | ............. | C23C/16/44 |

OTHER PUBLICATIONS

International Search Report, dated May 21, 2003 for PCT/US03/00962.

* cited by examiner

Primary Examiner—Parviz Hassanzadeh
Assistant Examiner—Karla Moore
(74) Attorney, Agent, or Firm—Moser, Patterson & Sheridan, LLP

(57) ABSTRACT

A semiconductor processing chamber having a motorized lid is provided. In one embodiment, the semiconductor processing chamber generally includes a chamber body having sidewalls and a bottom defining an interior volume. A lid assembly is coupled to the chamber body and is movable between a first position that encloses the interior volume and a second position. A hinge assembly thereto is coupled between the lid assembly and the chamber body. A motor is coupled to the hinge assembly to facilitate moving the lid assembly between the first position and the second position.

21 Claims, 8 Drawing Sheets

MOTORIZED CHAMBER LID

BACKGROUND OF THE INVENTION

1. Field of the Invention

Embodiments of the invention generally relate to a semiconductor processing chamber having a motorized chamber lid.

2. Description of the Related Art

Semiconductor wafer processing is generally performed in vacuum chambers having lid assemblies that may be opened for maintenance and replacement of process kits. In processing chambers configured for 200 mm and smaller substrates, these lid assemblies generally are opened manually. In larger systems, the lid assemblies may weigh in excess of 300 pounds. The weight of these lid assemblies has led to the incorporation of spring, gas pots and counterbalances for facilitating the opening and closing of the lid assembly.

One typical arrangement includes gas or mechanical springs coupled to a hinge of the lid assembly. The spring applies a bias to the lid assembly to counteract the weight of the lid as the lid is opened and closed. Counterbalance systems are also commonly used to facilitate opening the lid assembly. Generally, the counterbalance system balances the weight of the lid across a pivot or hinge with a counterbalance weight. Although the systems have been successfully employed to assist in reducing the force required to open the lid assembly, each arrangement has some attribute that is generally not favorable for semiconductor processing.

For example, systems employing springs generally are not favored due to the possibility of particulate contamination. Flexing of the spring and the interplay between the spring and its housing generates particles. As these springs are typically located at or near the lid assembly, these particles may fall into the processing chamber and cause subsequent contamination during wafer processing.

Systems utilizing counterbalances require dedicated free space proximate the chamber to allow movement of the counterbalance. Moreover, as the center of gravity for the lid assembly and counterbalance often are not matched about the center of rotation of the lid assembly, the force required to open the lid assembly may vary as the lid assembly is rotated away from the chamber. This makes opening the lid assembly difficult to control.

Therefore, there is a need for an improved device for opening a semiconductor chamber lid assembly.

SUMMARY OF THE INVENTION

A semiconductor processing chamber having a motorized lid is provided. In one embodiment, the semiconductor processing chamber generally includes a chamber body having sidewalls and a bottom defining an interior volume. A lid assembly is coupled to the chamber body and is movable between a first position that encloses the interior volume and a second position. A hinge assembly thereto is coupled between the lid assembly and the chamber body. A motor is coupled to the hinge assembly to facilitate moving the lid assembly between the first position and the second position.

In another embodiment, the semiconductor processing chamber generally includes a chamber body having sidewalls and a bottom defining an interior volume. A lid is coupled to the chamber body and has a bottom movable between a first position that encloses the interior volume and a second position. A target is coupled to the bottom of the lid. One or more mounting brackets are coupled to the lid assembly and a shaft that is rotatably coupled to one or more bearing mounts. A motor is coupled to at least one of the shaft or mounting brackets and moves the lid assembly between the first position and the second position. In one alternative embodiment, the shaft is coplanar with an upper surface of the chamber body to reduce wear of a seal that is disposed between the lid and chamber body when closing the lid.

DESCRIPTION OF THE DRAWINGS

A more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

The invention generally provides a semiconductor processing chamber having a lid controllably opened and closed by a motor assembly. Although the invention is disclosed and illustrated in a physical vapor deposition (PVD) chamber, the disclosure is one of illustration, and accordingly, the invention finds utility in other semiconductor processing chambers including transfer chambers, load lock chambers, etch chambers and chemical vapor deposition chambers among others.

Figure 1:
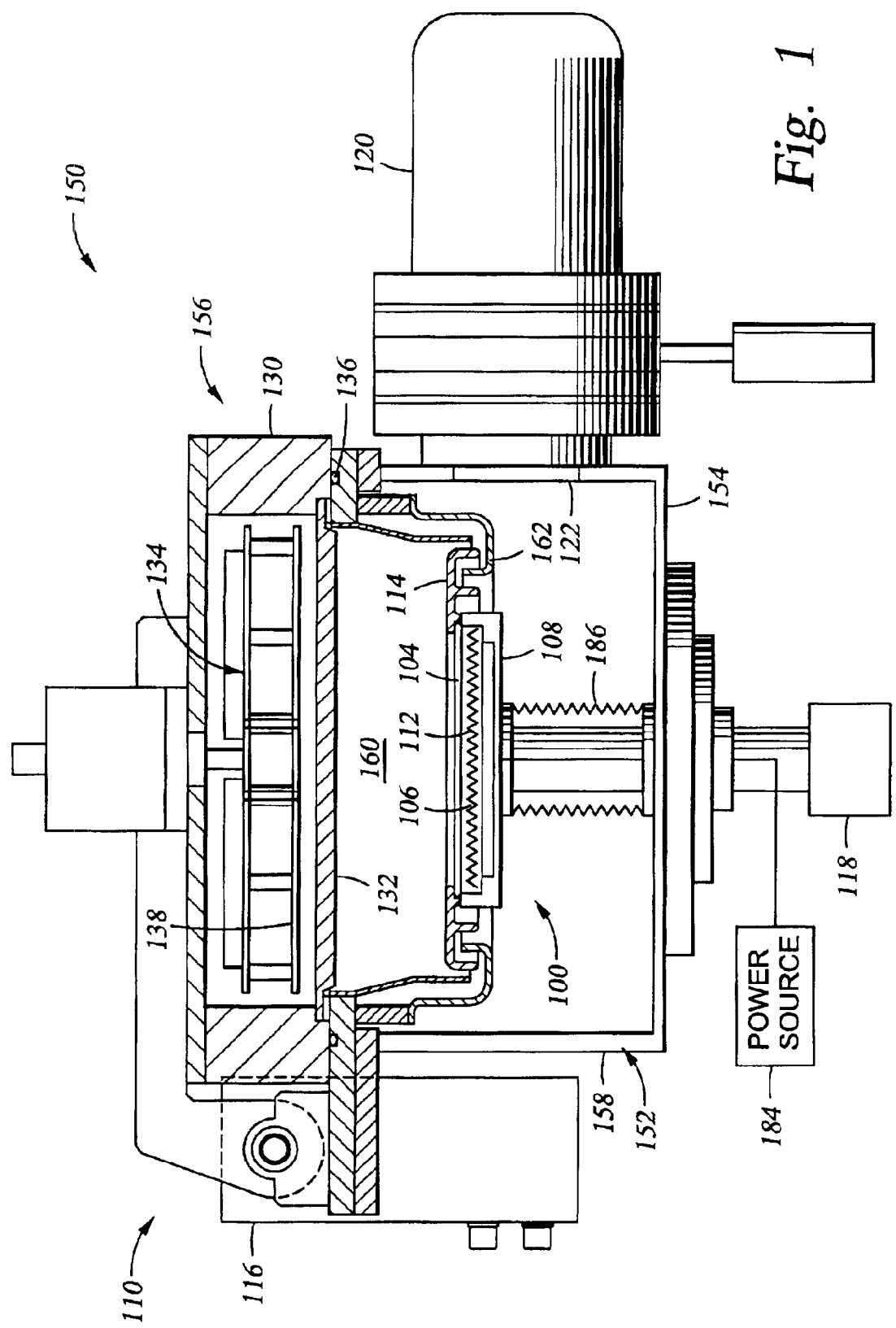
FIG. 1 depicts one embodiment of a semiconductor processing system having a motorized lid.

FIG. 1 depicts one embodiment of a semiconductor processing chamber 150. One example of a processing chamber that may be adapted to benefit from the invention is an IMP VECTRA™ PVD processing chamber, available from Applied Materials, Inc., of Santa Clara, Calif.

The exemplary processing chamber 150 includes a chamber body 152 having a bottom 154, lid assembly 156 and sidewalls 158 that define an evacuable interior volume 160. The chamber body 150 is typically fabricated from welded plates of stainless steel or a unitary block of aluminum. The sidewalls 158 generally contain a sealable access port (not shown) to provide for entrance and egress of the substrate 104 from the processing chamber 150. A pumping port 122 disposed in the sidewalls 158 is coupled to a pumping system 120 that exhausts and controls the pressure of the interior volume 160. The lid assembly 156 of the chamber 150 generally supports an annular shield 162 suspended therefrom that supports a shadow ring 114. The shadow ring 114 is generally configured to confine deposition to a portion of the substrate 104 exposed through the center of the shadow ring 114.

A pedestal assembly 100 is generally disposed on the bottom 154 of the chamber 150 and supports the substrate 104 during processing. The pedestal assembly 100 is coupled to the bottom 154 by a lift mechanism 118 that is configured to move the pedestal assembly 100 between an upper (as shown) and lower position. In the upper position, the substrate 104 is disposed on the pedestal assembly 100 and engages the shadow ring 114, lifting the shadow ring 114 from the shield 162.

In the lower position, the pedestal assembly 100 is positioned below the shield 162 that allows the substrate 104 to be removed from the chamber 150 through the access port disposed in the sidewall 158 while clearing the ring 114 and shield 162. Additionally, in the lower position, lift pins (not shown) are moved through the pedestal assembly 100 to space the substrate 104 from the pedestal assembly 100 to facilitate securing of the substrate 104 by a wafer transfer mechanism disposed exterior to the processing chamber 150 such as a single blade robot (not shown). A bellows 186 is typically disposed between the pedestal assembly 100 and the chamber bottom 154 to isolate the interior volume 160 of the chamber body 152 from the interior of the pedestal assembly 100.

The pedestal assembly 100 generally includes a substrate support 102 sealingly coupled to a platform housing 108. The platform housing 108 is typically fabricated from a metallic material such as stainless steel or aluminum. A cooling plate 124 is generally disposed within the platform housing 108 to thermally regulate the substrate support 102. One pedestal assembly 100 that may be adapted to benefit from the invention is described in U.S. Pat. No. 5,507,499, issued Apr. 16, 1996 to Davenport et al., which is incorporated herein by reference in its entirety.

The substrate support 102 is typically comprised of ceramic and may be an electrostatic chuck, a ceramic body, a heater or a combination thereof. In one embodiment, the substrate support 102 is an electrostatic chuck that includes a dielectric body 106 having a conductive layer 112 embedded therein. The dielectric body 106 is typically fabricated from a high thermal conductivity dielectric material such as pyrolytic boron nitride, aluminum nitride, silicon nitride, alumina or an equivalent material.

The lid assembly 156 generally includes a lid 130, a target 132 and a magnetron 134. The lid 130 is supported by the sidewalls 158 when in a closed position as shown in FIG. 1. A seal 136 is disposed between the lid 130 and sidewalls 158 to prevent vacuum leakage therebetween.

The target 132 is coupled to the lid 130 and exposed to the interior volume 160 of the processing chamber 150. The target 132 provides material which is deposited on the substrate 104 during a PVD process. The target 132 and pedestal assembly 100 are biased relative each other by a power source 184. A gas such as argon is supplied to the volume 160 from a gas source (not shown). A plasma is formed between the substrate 104 and the target 132 from the gas. Ions within the plasma are accelerated toward the target 132 and cause material to become dislodged from the target 132. The dislodged target material is deposited on the substrate 104.

The magnetron 134 is coupled to the lid 130 on the exterior of the processing chamber 150. The magnetron 134 includes at least one rotating magnet assembly 138 that promotes uniform consumption of the target 132 during the PVD process. One magnetron which may be utilized is described in U.S. Pat. No. 5,953,827, issued Sep. 21, 1999 to Or et al., which is hereby incorporated by reference in its entirety.

A hinge assembly 110 couples the lid assembly 156 to the processing chamber 150. A motorized actuator 116 is coupled to the hinge assembly 110 and/or lid 130 to facilitate movement of the lid assembly 156 between an open and closed portion.

Figure 2:
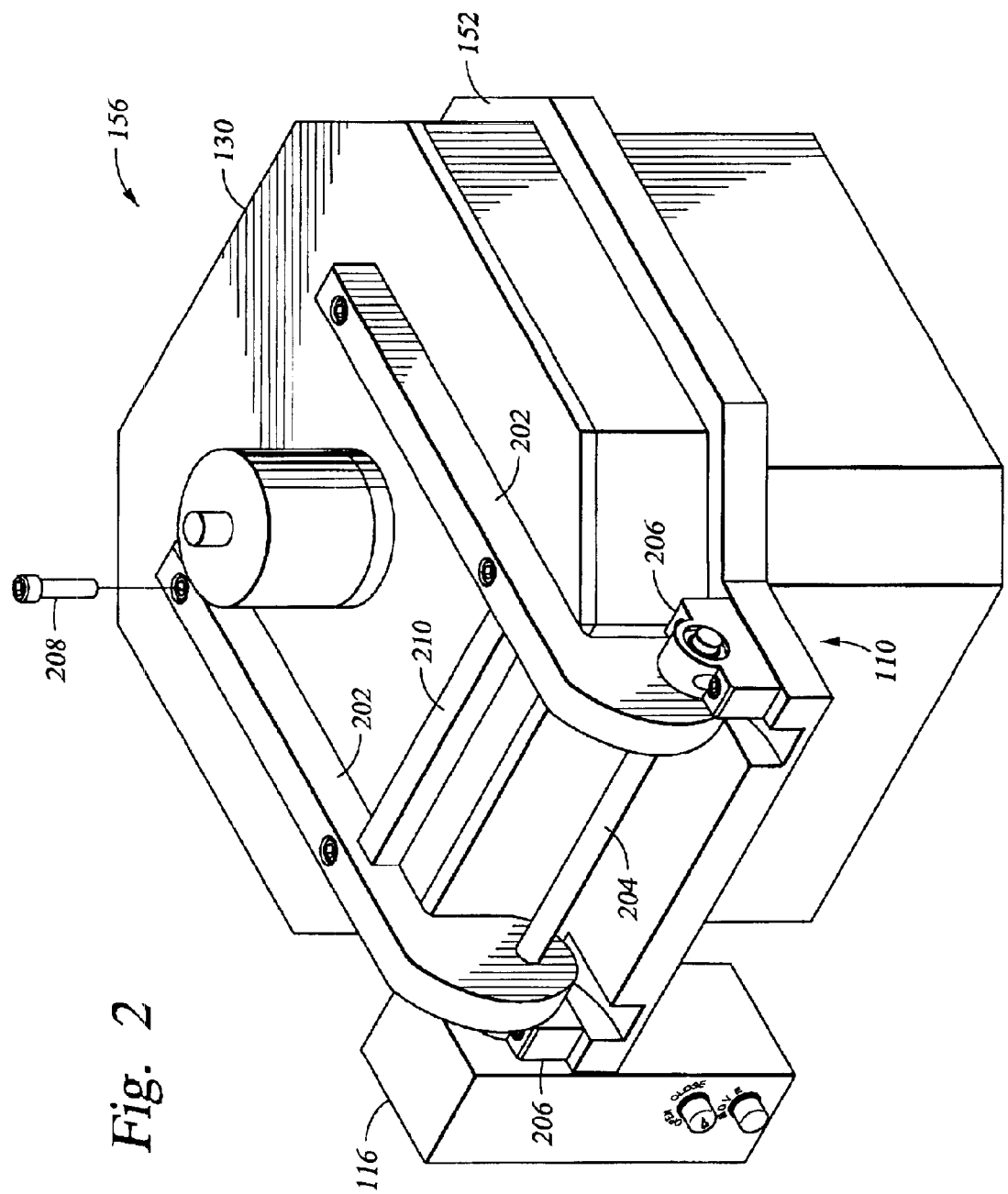
FIG. 2 is perspective view of the processing system of FIG. 1.

FIG. 2 depicts one embodiment of the hinge assembly 110 in greater detail. The hinge assembly 110 generally includes at least one mounting bracket, a shaft, and at least one bearing mount. In the embodiment depicted in FIG. 2, the hinge assembly 110 includes two mounting brackets 202 coupled between the lid assembly 156 and a shaft 204, and two bearing mounts 206 coupled to the processing chamber 150 and rotatably receiving the shaft 204. A brace 210 is fastened or welded between the brackets 202 to provide rigidity.

Figure 3:
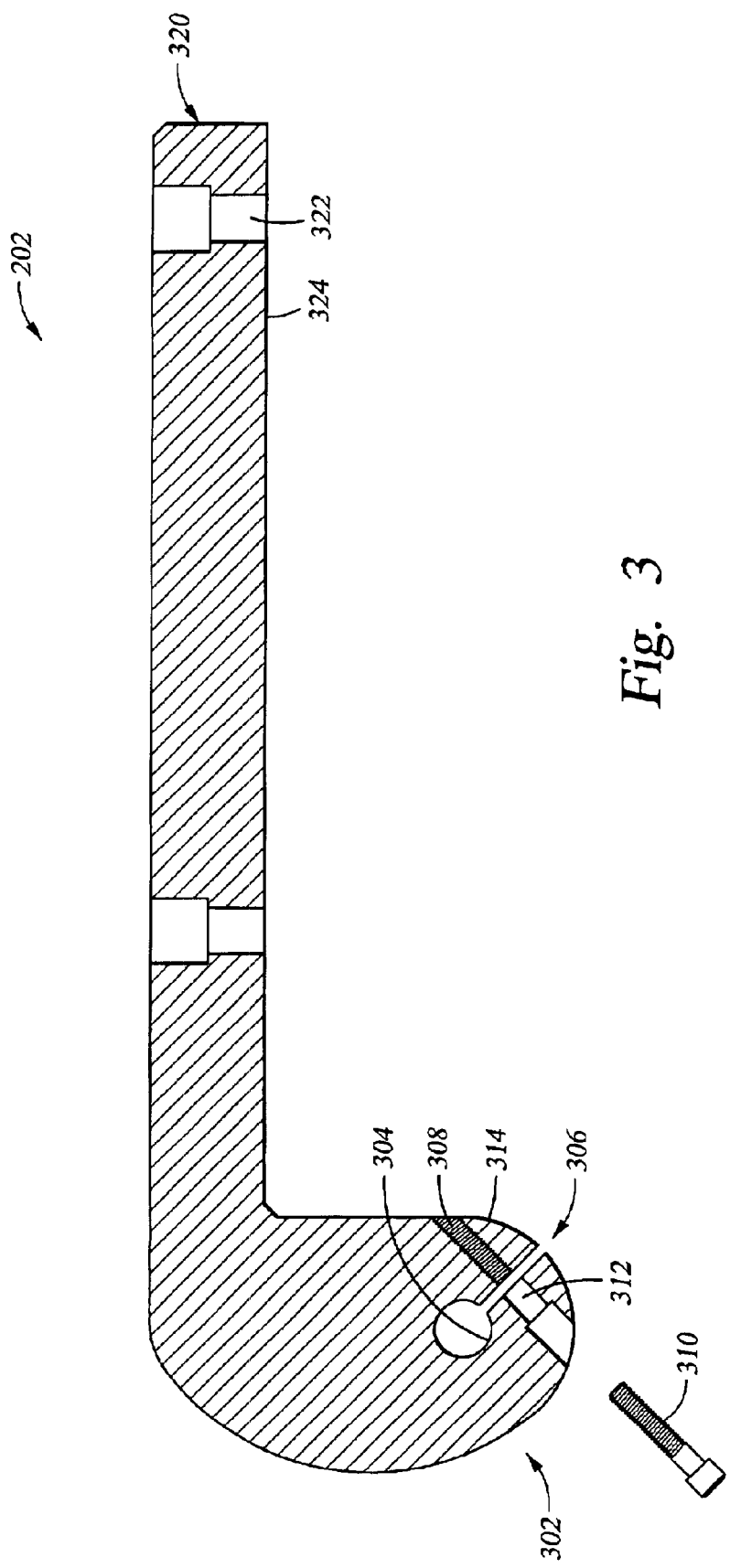
FIG. 3 depicts one embodiment of a mounting bracket.

Referring to FIG. 3, each mounting bracket 202 includes a first end 302 and a second end 320. A shaft receiving hole 304 is disposed in the first end 302. The shaft receiving hole 304 includes a shaft locking device 306 that prevents rotation between the shaft 204 and the mounting bracket 202. The shaft locking device 306 may be a key and slot, spline, set screw, dowel pin, spring pin, locking adhesive or weldment. In the embodiment depicted in FIG. 2, a slot 308 is disposed through the mounting bracket 202 from one edge of the bracket 202 and communicating with the hole 304. A fastener 310 is disposed in a cross hole having a first portion 312 on a first side of the slot 308 and a threaded second portion 314 on the other side of the slot 308. As the fastener 310 is tightened to close the slot 308, the diameter of the hole 304 is narrowed thereby clamping the shaft 204. Alternatively, the shaft 204 may be welded to the brackets 202.

The second end 320 of the mounting bracket 202 includes a plurality of mounting holes 322. A fastener 208 (seen in FIG. 2) passes through each mounting hole 322 and secures a bottom 324 of each mounting bracket 202 to the lid assembly 156. The mounting bracket 202 may be coupled to the lid assembly 156 in other manners.

Figure 4:
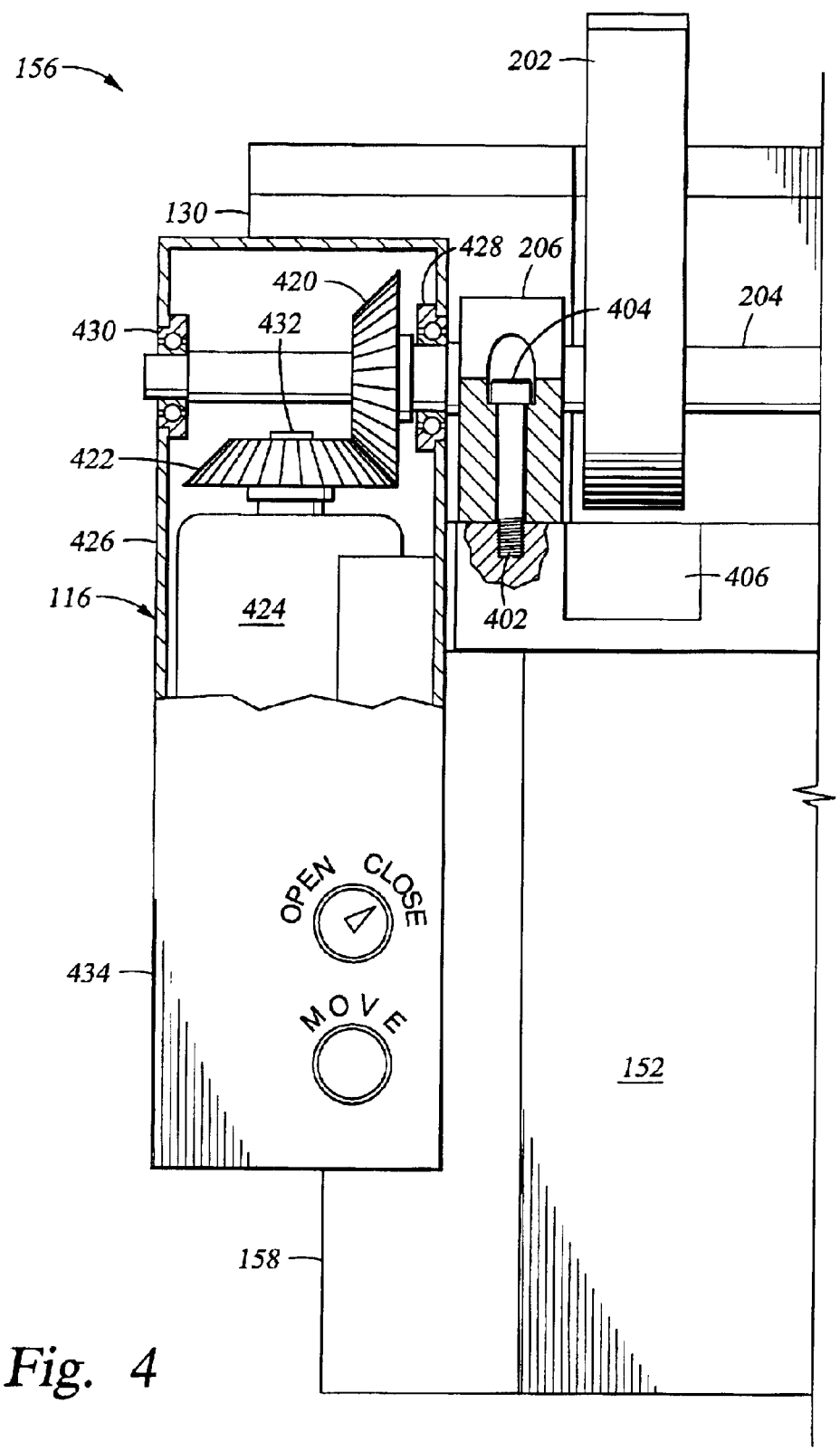
FIG. 4 depicts a partial sectional view of one embodiment of a hinge assembly.

Referring to FIG. 4, the chamber body 152 generally includes a plurality of slots 406 formed in the sidewalls 158. The slots 406 are configured to accommodate a portion of the brackets 202 as the lid assembly 156 is rotated to an open position. Alternatively, the hinge assembly 110 may be configured to eliminate the need for the slots 406 by adjusting the geometry of the bearing mounts 206 and/or mounting brackets 202 or providing spacers (not shown) coupled between the bearing mounts 206 and chamber body 152 to provide clearance between the mounting brackets 202 and chamber body 152.

The bearing mounts 206 generally include a bearing that facilitates rotation of the shaft 204 disposed therethrough. The bearing mounts 206 are coupled to the chamber body 152 typically outboard of the mounting brackets 202. A plurality of fasteners 404 generally thread into a threaded hole 402 formed in the sidewalls 158 to secure the mounting brackets 202 to the chamber body 152. The bearing mounts 206 may be alternatively fastened or coupled to other portions of the processing system 150 or cluster tools or support frames (not shown).

Figure 5A:
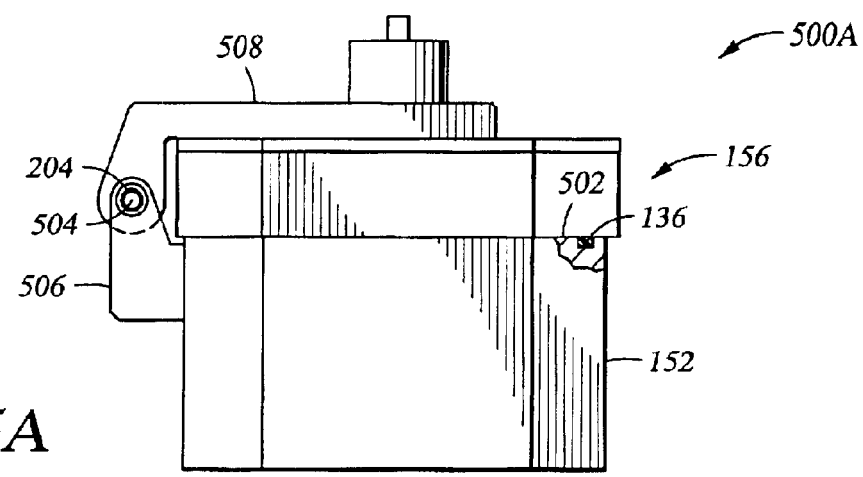
FIGS. 5A–C depicts various embodiments of processing systems having hinge assemblies.
Figure 5B:
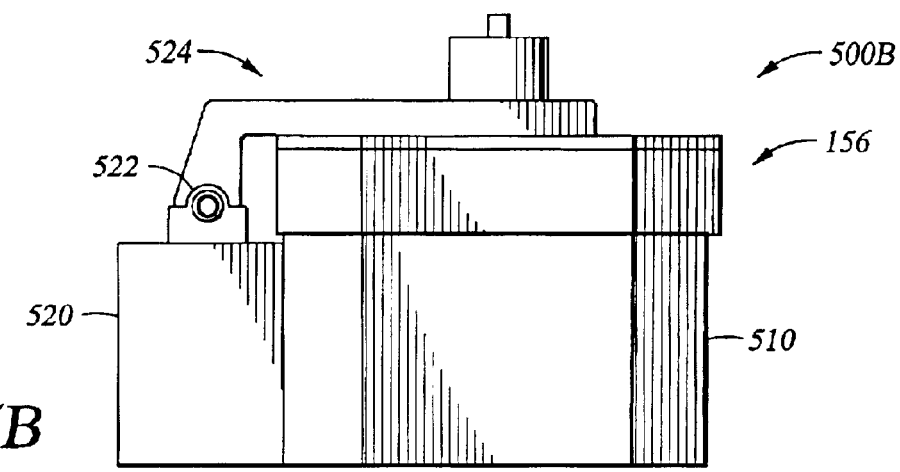
Figure 5C:
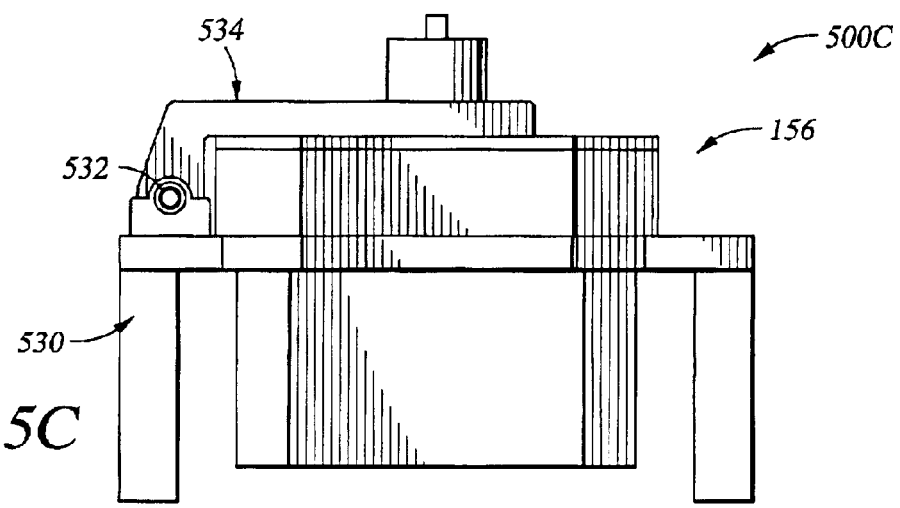

FIGS. 5A–C depicts processing systems having alternative mounting locations for the bearing mounts. In FIG. 5A, a processing system 500A has bearing mounts 506 coupled to the sidewalls 158 of the chamber body 152. The bearing mounts 506 are positioned so that a center axis 504 of the shaft 204 retained by the mounts 506 is disposed substantially within a plane defined by a top surface 502 of the chamber body 152. In this manner, the lid assembly 156 held by brackets 508 is moving substantially normal to the seal 136 to minimize lateral motion across the seal 136 that may generate particles.

Referring to FIG. 5B, a processing system 500B includes a chamber body 510 that is coupled to a processing platform or cluster tool 520. Bearing mounts 522 of a hinge assembly 524 supporting the lid assembly 156 of the system 500B are coupled to the cluster tool 520.

Referring to FIG. 5C, a processing system 500C is supported by a frame 530 circumscribing the processing system 500C. Bearing mounts 532 of a hinge assembly 534 supporting the lid assembly 156 are coupled to the frame 530.

Referring back to FIG. 4, the motorized actuator 116 is generally coupled to sidewalls 158 of the chamber body 152. The motorized actuator 116 generally includes a first gear 420, a second gear 422 and a motor 424 all disposed in a housing 426. The housing 426 is typically coupled to the sidewalls 158 and includes at least a first bearing 428 that guides the shaft 204 into the motorized actuator 116. In the embodiment depicted in FIG. 4, a second bearing 430 is disposed on the housing wall opposite the first bearing 428 to ensure shaft alignment during operation. The bearings 428, 430 allow for the bearing 206 disposed proximate the housing 426 to be optionally eliminated.

The first gear 420 is disposed on the shaft 204 between the bearings 428, 430. The first gear 420 is keyed or otherwise fixed to the shaft 204. The first gear 420 meshes with the second gear 422 that is coupled to a output shaft 432 of the motor 424. As the motor 424 rotates the output shaft 432, the shaft 204 of the hinge assembly 110 is rotated, thereby rotating the lid assembly 156 between the open and closed positions as desired.

The motor 424 may be a stepper, servo, gear, hydraulic, pneumatic or other type of motor that facilitates controllable rotation of the shaft 204. The motor 424 may alternatively be coupled directly to the shaft 204 without gears.

A motor controller 434 may be coupled to the housing 426 or remotely located to control the movement of the lid assembly 156. Rotational control of the lid assembly 156 may alternatively be realized by utilizing alternative controllers coupled to or remote from motor 424, including controllers utilized to control the processing system 150.

In order to insure alignment and proper sealing of the lid assembly 156 and chamber body 152, a plurality of locating pins are disposed between the lid assembly 156 and chamber body 152. A first set of locating pins are located along section lines 6A—6A, 6B—6B and a second set of locating pins are located along section lines 7A—7A, 7B—7B.

Figure 6:
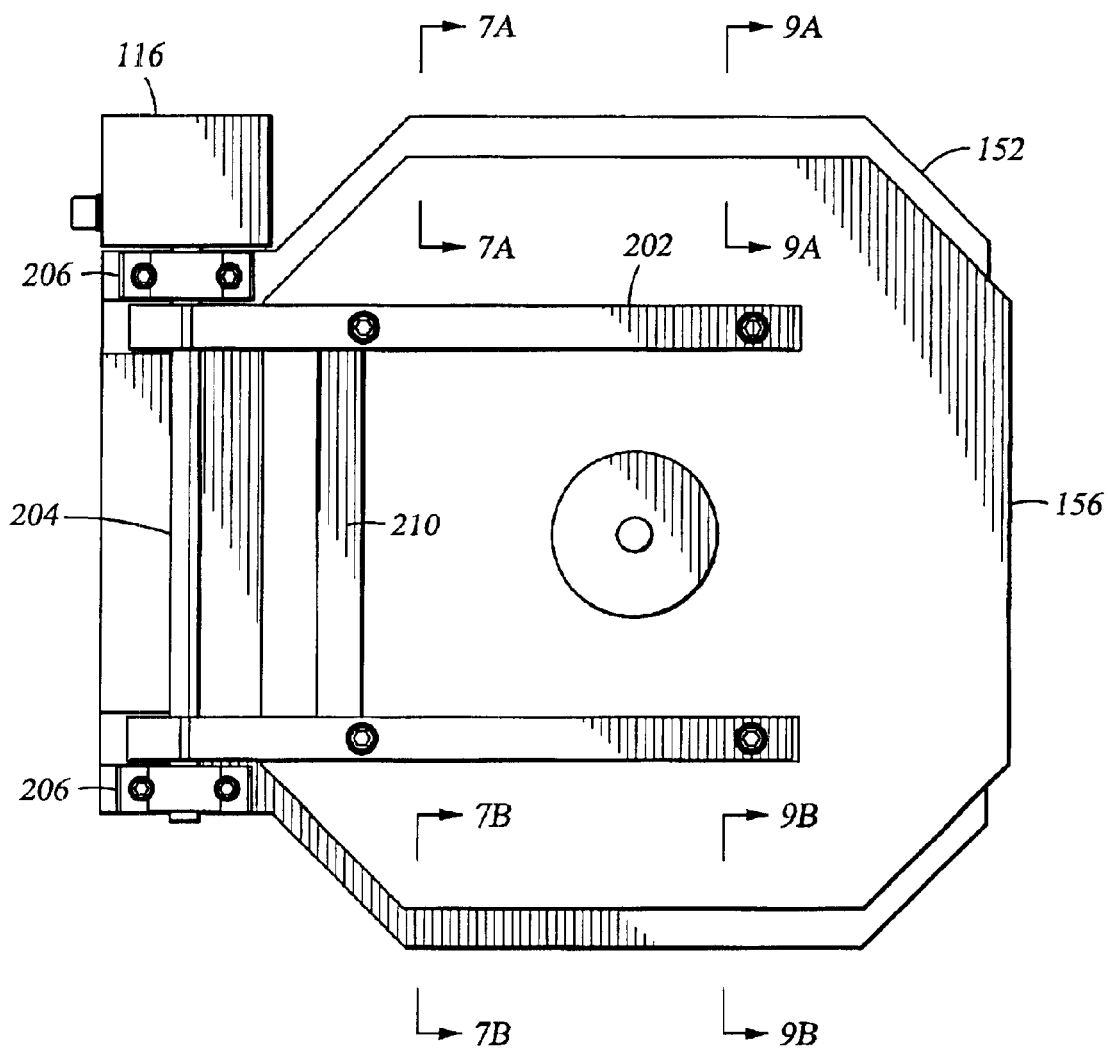
FIG. 6 is a top view of one embodiment of a processing system.

FIG. 6 depicts a top view of the chamber body 152 and lid assembly 156. To ensure proper seating of the lid assembly 156 on the chamber body 152 and location of the target 132 within the interior volume 160, a plurality of locating devices are disposed between the chamber body 152 and lid assembly 156. As the rotation of the lid assembly 156 causes the locating devices disposed closer to the shaft 204 to interface with the lid assembly 156 and body 152 before locating devices disposed radially outward therefrom, a first set of locating devices disposed along section lines 7A—7A and 7B—7B are configured differently from a second set of locating devices disposed along section lines 9A—9A and 9B—9B.

Figure 7:
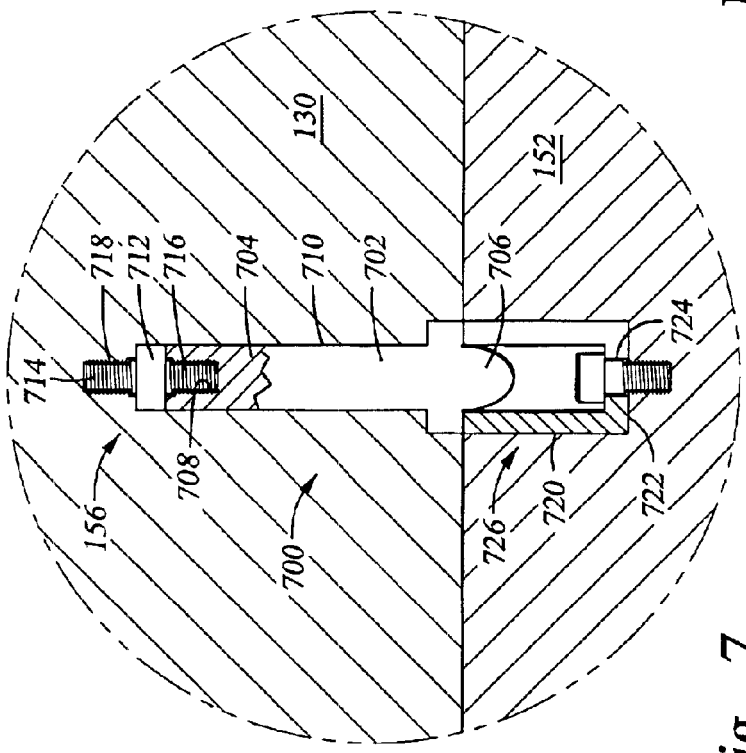
FIG. 7 is a sectional view of one embodiment of a locating device.

FIG. 7 depicts a sectional view of one embodiment of a locating device 700 disposed along section lines 7A—7A and 7B—7B. The locating device 700 includes a first locating pin 702 disposed between the lid assembly 156 and the chamber body 152. The pin 702 generally has a mounting portion 704 and a locating portion 706. The mounting portion 704 typically has a threaded center 708. The mounting portion 704 fits within a hole 710 disposed in the lid 130. The mounting portion 704 may be coupled to the lid 130 through a variety of methods including adhering, press fitting, screwing, staking and fastening among others. In the embodiment depicted in FIG. 7, a stud 712 is utilized to couple the mounting portion 704 and lid 130. The stud 712 has a first and a second threaded portions 714, 716 on opposing ends. The first threaded portion 714 is threaded into a threaded hole 718 disposed in the lid 130. The second threaded portion 716 is threaded into the threaded center 708 formed in the mounting portion 704 thereby retaining the first pin 702 to the lid 130.

The locating portion 706 of the first pin 702 extends beyond the lid 130 and is generally rounded, conical or ellipsoidal in shape to facilitate entry into a locating bushing 726 disposed in the chamber body 152. The locating portion 706 of the first pin 702 is generally fabricated from a hard material such as stainless steel or other material that slidingly interfaces with the bushing 726 without excess particulate generation.

Figure 8:
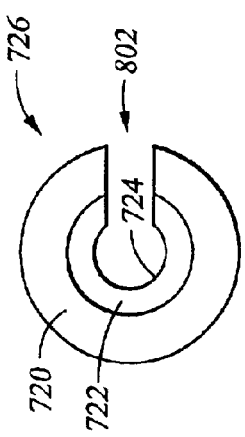
FIG. 8 is a top view of a bushing depicted in FIG. 7.

The bushing 726 depicted in FIGS. 7 and 8 generally has a cylindrical upper portion 720 and a bottom end portion 722. The bushing 726 is generally fabricated from a material that promotes entry of the first pin 702 without excess particulate generation such as a polymer, for example, DELRIN®. The bottom end portion 722 includes a mounting hole 724 that facilitates fastening the bushing 726 to the chamber body 152.

A slit 802 is formed through the upper portion 720 and end portion 722 of the bushing 726. The slit 802 gives the bushing a "C" shaped cross section that allows the bushing 726 to slightly expand to accept the second locating pin 702. Since the first pin 702 is disposed at an angle to the bushing 726 as the lid assembly 156 first beings to close, the ability of the bushing 726 to expand facilitates entry of the pin 702 into the bushing 726 thereby extending the service life of the locating device 700 while minimizing particulate generation. As the bushing 726 is comprised of a material softer than the first pin 702, the bushing 726 may be readily replaced as it wears with minimal time and/or cost expenditures. The locating pin and bushing disposed along section line 7B—7B are similarly configured.

Figure 9:
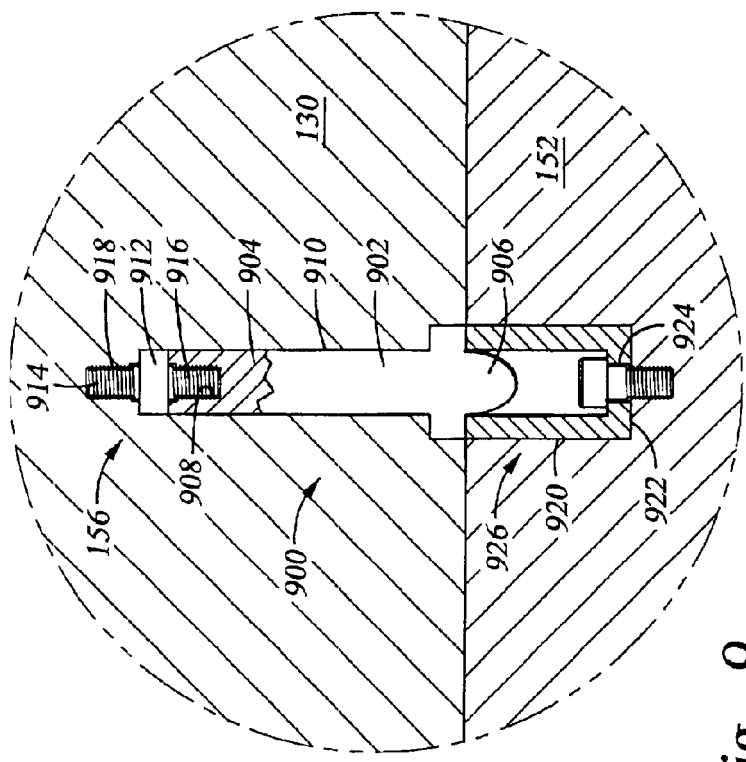
FIG. 9 is a sectional view of another embodiment of a locating device.

FIG. 9 depicts a sectional view of one embodiment of a locating device 900 disposed along section lines 9A—9A and 9B—9B. The locating device 900 includes a first locating pin 902 disposed between the lid assembly 156 and the chamber body 152. The pin 902 generally has a mounting portion 904 and a locating portion 906. The mounting portion 904 typically has a threaded center 908. The mounting portion 904 fits within a hole 910 disposed in the lid 130.

The mounting portion 904 may be coupled to the lid 130 through a variety of methods including adhering, press fitting, screwing, staking and fastening among others. In the embodiment depicted in FIG. 9, a stud 912 having a first and a second threaded portions 914, 916 on opposing ends. The first threaded portion 914 is threaded into a threaded hole 918 disposed in the lid 130. The second threaded portion 916 is threaded into a threaded hole formed in the mounting portion 904 of the first pin 902 thereby retaining the first pin 902 to the lid 130.

The locating portion 906 of the first pin 902 extends beyond the lid 130 and is generally rounded or ellipsoidal in shape to facilitate entry into a locating bushing 926 disposed in the chamber body 152. The locating portion 906 of the first pin 902 is generally fabricated from a hard material such as stainless steel or other material that slidingly interfaces with the bushing 926 without excess particulate generation.

Figure 10:
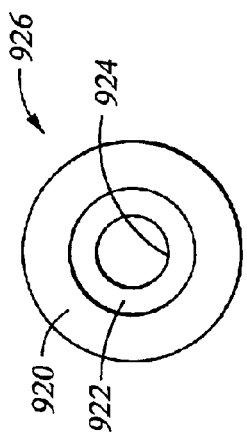
FIG. 10 is a top view of a bushing depicted in FIG. 9.

The bushing 926 depicted in FIGS. 9 and 10 generally has a generally cylindrical upper portion 920 and a bottom end portion 922. The bushing 926 is generally fabricated from a material similar to the bushing 618 described above. The bottom end portion 922 includes a mounting hole 924 that facilitates fastening the bushing 926 to the chamber body 152.

Figure 11:
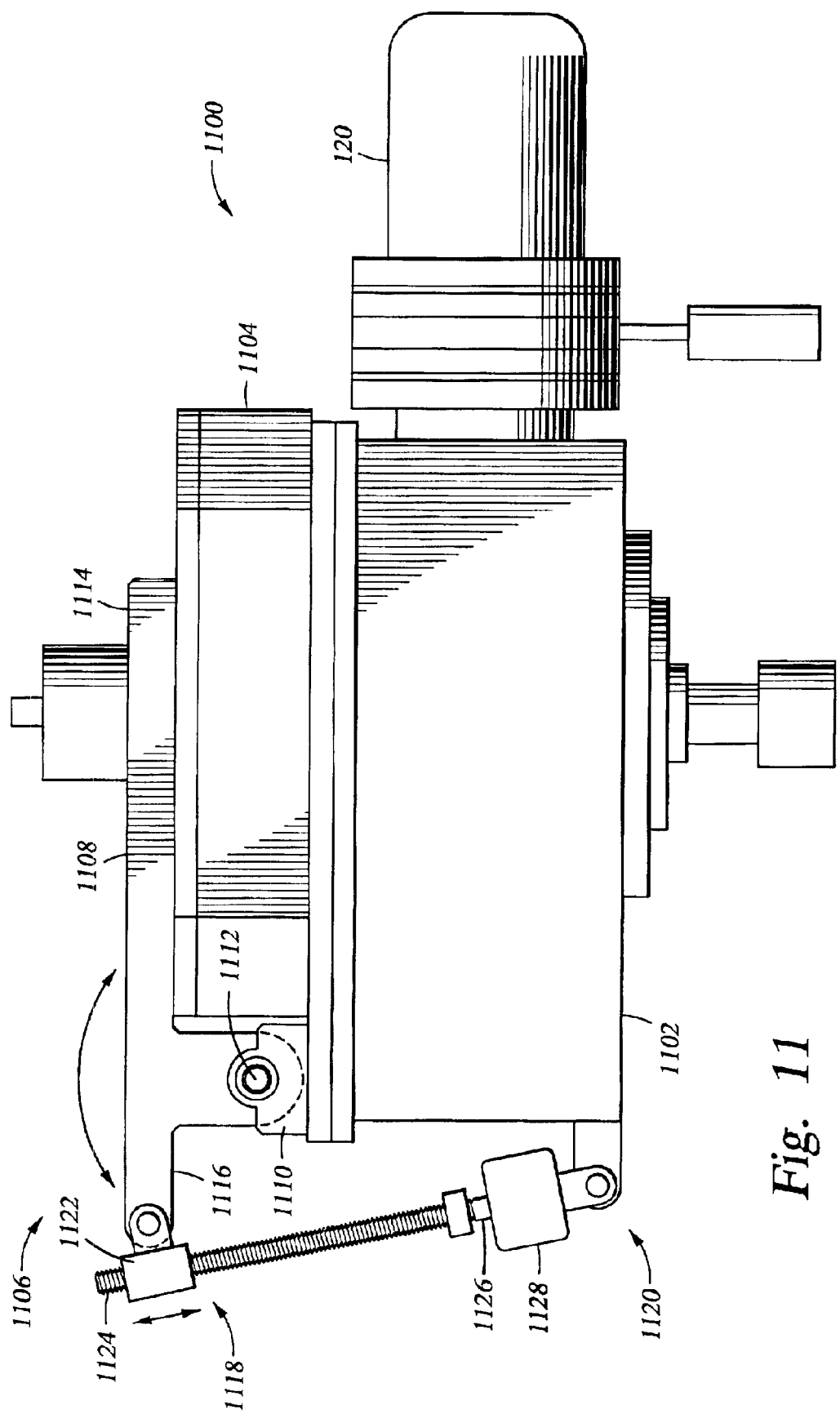
FIG. 11 depicts another embodiment of a processing system having a motorized lid.

FIG. 11 depicts an alternative embodiment of a processing system 1100. The processing system 1100 includes a chamber body 1102 having a lid assembly 1104 rotatably coupled thereto by a hinge assembly 1106. The hinge assembly 1106 includes one or more mounting brackets 1108, one or more bearing mounts 1110 and a shaft 1112. The mounting bracket 1108 is coupled to the lid assembly 1104 at a first end 1114 and to a motorized actuator 1118 at a second end 1116. The mounting bracket 1108 is coupled to shaft 1112 between the first and second ends 1114, 1116.

The motorized actuator 1118 may be a pneumatic, hydraulic or electric motor or cylinder that controllably causes the second end 1116 of the mounting bracket 1108 to move linearly relative to an end 1120 of the motorized actuator 1118 that is typically coupled to the chamber body 1102. In the embodiment depicted in FIG. 11, the motorized actuator 1118 comprises a guide 1122 disposed on a threaded shaft 1124 rotationally coupled to an output shaft 1126 of a motor 1128. The second end 1116 of the mounting bracket 1108 is coupled to the guide 1122 and is moved along the shaft 1124 as the output shaft 1126 is rotated, thereby causing the lid assembly 1104 to move relative to the chamber body 1102.

While the foregoing is directed to the preferred embodiment of the present invention, other and further embodiments of the invention may be devised without departing from the basic scope thereof, and the scope thereof is determined by the claims that follow.

What is claimed is:

1. A semiconductor processing chamber comprising:
   a chamber body having sidewalls and a bottom defining an interior volume;
   a lid assembly coupled to the chamber body and movable between a first position enclosing the interior volume and a second position;
   a hinge assembly coupled between the lid assembly and the chamber body, wherein the hinge assembly further comprises:
      one or more mounting brackets coupled to the lid assembly;
      a shaft coupled to the mounting brackets and coplanar with the upper surface of the chamber body; and
      one or more bearing mounts rotatably coupled to the shaft; and
   a motor coupled to the hinge assembly for moving the lid assembly between at least the first position and the second position.

2. The semiconductor processing chamber of claim 1, wherein the bearing mounts are coupled to the chamber body, a frame circumscribing the chamber body or a processing platform having the chamber body coupled thereto.

3. The semiconductor processing chamber of claim 1, wherein the lid assembly further comprises a target and a magnetron.

4. A semiconductor processing chamber comprising:
   a chamber body having sidewalls and a bottom defining an interior volume;
   a lid assembly coupled to the chamber body and movable between a first position enclosing the interior volume and a second position;
   a hinge assembly coupled between the lid assembly and the chamber body;
   a motor coupled to the hinge assembly for moving the lid assembly between at least the first position and the second position;
   a plurality of first locating devices disposed between the lid assembly and the chamber body disposed proximate a shaft of the hinge assembly; and
   a plurality of second locating devices disposed between the lid assembly and the chamber body, the second locating devices disposed outward of the first locating devices relative the shaft.

5. The semiconductor processing chamber of claim 4, wherein each of the first locating devices further comprises:
   a pin and a bushing having a "C" shaped cross section.

6. The semiconductor processing chamber of claim 5, wherein each of the second locating devices further comprises:
   a pin and a cylindrical bushing.

7. The semiconductor processing chamber of claim 5, wherein the pin is coupled to the lid assembly.

8. A semiconductor processing chamber comprising:
   a chamber body having sidewalls and a bottom defining an interior volume;
   a lid coupled to the chamber body and having a bottom movable between a first position enclosing the interior volume and a second position;
   a target coupled to the bottom of the lid;
   a first mounting bracket coupled to the lid assembly;
   a shaft coupled to the first mounting bracket;
   one or more bearing mounts rotatably coupled to the shaft;
   a motor coupled to at least one of the shaft or first mounting bracket for moving the lid assembly between at least the first position and the second position;
   a first bushing having a "C" shaped cross section disposed in the chamber body;
   a first pin disposed between the lid assembly and the chamber body wherein a portion of the first pin mates with the first bushing;
   a second bushing having a cylindrical cross section disposed in the chamber body outward of the first bushing relative to the shaft; and
   a second pin disposed between the lid assembly and the chamber body wherein a portion of the second pin mates with the second bushing.

9. The semiconductor processing chamber of claim 8, wherein the shaft is coplanar with the upper surface of the chamber body.

10. The semiconductor processing chamber of claim 8, further comprising:

a second mounting bracket coupled to the lid assembly and the shaft; and a brace coupled between the first and second mounting brackets.

11. A physical vapor deposition chamber comprising:

a chamber body having sidewalls and a bottom defining an interior volume;

a lid coupled to the chamber body and having a bottom movable between a first position enclosing the interior volume and a second position;

a target coupled to the bottom of the lid;

one or more mounting brackets coupled to the lid assembly;

a shaft fixed to the mounting brackets;

one or more bearing mounts disposed on the chamber body and rotatably coupled to the shaft;

a motor coupled to at least one of the shaft or mounting brackets for moving the lid assembly between at least the first position and the second position;

a first bushing having a "C" shaped cross section disposed in the chamber body;

a first pin disposed between the lid assembly and the chamber body wherein a portion of the first pin mates with the first bushing;

a second bushing having a cylindrical cross section disposed in the chamber body outward of the first bushing relative to the shaft; and a second pin disposed between the lid assembly and the chamber body wherein a portion of the second pin mates with the second bushing.

12. The semiconductor processing chamber of claim 1, wherein the motor is coupled to the shaft.

13. The semiconductor processing chamber of claim 1 further comprising:

a plurality of first locating devices disposed between the lid assembly and the chamber body disposed proximate a shaft of the hinge assembly; and a plurality of second locating devices disposed between the lid assembly and the chamber body, the second locating devices disposed outward of the first locating devices relative the shaft.

14. The semiconductor processing chamber of claim 13, wherein each of the first locating devices further comprises:

a pin and a bushing having a "C" shaped cross section.

15. The semiconductor processing chamber of claim 14, wherein each of the second locating devices further comprises:

a pin and a cylindrical bushing.

16. The semiconductor processing chamber of claim 14, wherein the pin is coupled to the lid assembly.

17. The semiconductor processing chamber of claim 4, wherein the hinge assembly further comprises:

one or more mounting brackets coupled to the lid assembly;

a shaft coupled to the mounting brackets; and one or more bearing mounts rotatably coupled to the shaft.

18. The semiconductor processing chamber of claim 17, wherein the motor is coupled to the shaft.

19. The semiconductor processing chamber of claim 17, wherein the bearing mounts are coupled to the chamber body, a frame circumscribing the chamber body or a processing platform having the chamber body coupled thereto.

20. The semiconductor processing chamber of claim 4, wherein the lid assembly further comprises a target and a magnetron.

21. The semiconductor processing chamber of claim 8, further comprising:

a first bushing having a "C" shaped cross section disposed in the chamber body; and a first pin disposed between the lid assembly and the chamber body wherein a portion of the first pin mates with the first bushing.

\* \* \* \* \*